(12) United States Patent  
Lee

(10) Patent No.: US 6,589,849 B1  
(45) Date of Patent: Jul. 8, 2003

(54) METHOD FOR FABRICATING EPITAXY BASE BIPOLAR TRANSISTOR

(76) Inventor: Chwan-Ying Lee, No. 195, Sec. 4 Chung Hsing Rd., Chutung Town, Hsinchu Hsien (TW)

(*) Notice: Subject to any disclaimer, the term of this patent is extended or adjusted under 35 U.S.C. 154(b) by 0 days.

(21) Appl. No.: 09/565,497

(22) Filed: May 5, 2000

(51) Int. Cl.$^7$ ............................................. H01L 21/331
(52) U.S. Cl. ......................... 438/341; 438/312; 438/364
(58) Field of Search ................................ 438/341, 364, 438/370, 339, 312, 320, 316

(56) References Cited

U.S. PATENT DOCUMENTS

| | | | | |
|---|---|---|---|---|
| 4,407,005 A | * | 9/1983 | Bell et al. | 257/592 |
| 4,929,570 A | * | 5/1990 | Howell | 438/207 |
| 5,106,767 A | * | 4/1992 | Comfort et al. | 438/341 |
| 5,504,018 A | * | 4/1996 | Sato | 148/DIG. 10 |
| 5,677,209 A | * | 10/1997 | Shon et al. | 148/DIG. 10 |
| 5,834,800 A | * | 11/1998 | Jalali-Farahani et al. | 257/198 |
| 6,239,477 B1 | * | 5/2001 | Johnson | 257/592 |

FOREIGN PATENT DOCUMENTS

JP      04-283935 A    * 10/1992

* cited by examiner

Primary Examiner—Michael Trinh

(57) ABSTRACT

A method for fabricating bipolar transistor having insitu-formed epitaxial base is disclosed herein, the method including the following steps. The first step of the key feature according to one preferred embodiment of the present invention is to use a first epitaxial process to selectively grow an epitaxial collector layer in the etched first oxide layer. The first oxide layer is formed on a buried layer, which is formed on the silicon substrate. Then utilize a second epitaxial process to subsequently grow a first epitaxial-base layer and a second epitaxial-base layer. Particularly the second epitaxial process and the first epitaxial process are performed insitu. Then a patterned oxide layer and poly silicon layer are formed on the second epitaxial-base layer. Followed by etching the poly silicon layer and the patterned oxide layer, the second epitaxial-base layer is implanted, which together with the first epitaxial-base layer are etched. The patterned second and first epitaxial-base layer make up the epitaxial base of the bipolar transistor, the patterned poly emitter layer makes up the emitter of the bipolar transistor, and the epitaxial collector layer makes up the collector of the bipolar transistor. Then a series of traditional processes are used to finish the fabrication of a bipolar transistor.

14 Claims, 13 Drawing Sheets

<prior art>

<prior art>

<prior art>

METHOD FOR FABRICATING EPITAXY BASE BIPOLAR TRANSISTOR

BACKGROUND OF THE INVENTION

1. Field of the Invention

The present invention relates to a method for forming SiGe bipolar transistor, and especially relates for a method for forming SiGe bipolar transistor that utilized in high frequency circuit with lowered thermal budget.

2. Description of the Prior Art

Because of the characteristic of the bipolar transistor, and the signal processed by the transistor in the radio frequency circuit is a signal having high frequency, the bipolar transistor, especially the SiGe bipolar transistor, is frequently employed in the radio frequency circuit. However the traditional SiGe bipolar transistor manufacturing process has many disadvantages such as low yield resulting from the low growth rate of the epitaxial growth process. In addition, in the traditional method, the epitaxial growth process is utilized two times when fabricating the SiGe bipolar transistor. The first epitaxial growth process is used to fabricate the collector layer, which is about 1 micron in thickness, and the second epitaxial growth process is used to form the epitaxial base layer. Because the epitaxial growth process takes a lot of time, thus the two epitaxial growth processes utilized by the traditional SiGe bipolar transistor manufacturing process take much more time, and take longer cycling time as well as lower yield.

In addition, before epitaxially grow the SiGe layer, it is necessary to proceed with the wafer, which is very troublesome. Also, it tends to waste manufacturing time and result lower yield to some extent. At first, the process sequence employed to manufacture the heterojunction bipolar transistor (HBT) is described to illustrate how a SiGe bipolar transistor is fabricated via the traditional process.

As shown in FIG. 1A, the first step is to form a P type epitaxial layer 10 on a silicon substrate 11, and the next step is to form a $n^+$ buried layer 12 on the P type epitaxial layer 10 by an implanting step. Followed by the foregoing implanting step, a $n^-$ epitaxial layer 14 is formed on the $n^+$ buried layer 12 by a first epitaxial growth step, which is controlled at the temperature from about 1000 to 1200 degrees in centigrade scale. Subsequently use a first photography step and a first etching step to etch the $n^-$ epitaxial layer 14 and then define the trench in the $n^+$ buried layer 12 and the P type epitaxial layer 10, which exposing a portion of the silicon substrate 11. The concentration of the conductive carrier in the $n^-$ epitaxial layer 14 is designed to be that of the collector of the SiGe bipolar transistor. The etched $n^-$ epitaxial layer 14 includes the first area 14a having a first cave and the second area 14b having a second cave.

The first area 14a is defined as the active area of the transistor that will be fabricated in the following processes, and the second area 14b is defined as the collector of the transistor that will be fabricated in the following processes. The next step is to form the trench isolation 16, which comprised of polysilicon portion 16a and oxide portion 16b at the interior surface of the trench at the bottom of both the first cave and the second cave. The silicon dioxide is then filled into the first cave in the etched portion of the $n^-$ epitaxial layer 14, so the first silicon dioxide pattern 18a is formed in the first area 14a of the $n^-$ epitaxial layer 14. In addition, the second silicon dioxide pattern 18b is formed in the second area 14b of the $n^-$ epitaxial layer 14.

After the active area and collector of the transistor have been defined, base of the transistor is to be defined in the following processes. However, a layer of native oxide is always expectedly formed on the surface of the first area 14a and the second area 14b of the $n^-$ epitaxial layer 14. Due to the unavoidable formation of the native oxide layer 22 on the $n^-$ epitaxial layer 14, referring to FIG. 1B, the first polysilicon layer 25 is formed on the native oxide layer 22. The wafer having the native oxide layer 22 on the second area 14b of the $n^-$ epitaxial layer 14 is immersed into HF to remove the exposed native oxide layer. It is important that the wafer must be directly sent to the tube which growing the GeSi epitaxial layer 30 (referring to FIG. 1C) without any cleaning step using water. The transmission of the wafer had been immersed into the HF is very dangerous for the operator, and a layer of several angstroms of native oxide layer 22 on the surface of the first area 14a of the $n^-$ epitaxial layer 14 still exist after the etching process using HF. Though the residual native oxide layer 22 is not shown in FIG. 1B and FIG. 1C, it still exist between the GeSi epitaxial layer 30 and the first area 14a of the $n^-$ epitaxial layer 14. So the yield of fabricating SiGe bipolar transistor using prior art is relatively lowered, and the cycling time is increased because the GeSi epitaxial layer 30 is formed by a second epitaxial growth process is controlled under about 550 degrees in centigrade scale.

The GeSi epitaxial layer 30 mentioned above is designed as the base of the SiGe bipolar transistor that is to be fabricated in the following processes, in addition, the SiGe bipolar transistor is usually employed in the high frequency circuit. So the concentration of the carrier and the thickness of the base of the SiGe bipolar transistor must be very carefully controlled.

After the GeSi epitaxial layer 30 had been formed on the surface of the second area 14b of the $n^-$ epitaxial layer 14, the first polysilicon layer 25 is transferred into the polycrystalline GeSi layer 35. Next, refer to FIG. 1D, a first silicon nitride layer 38 and a second polysilicon layer 40 are subsequently formed on the GeSi epitaxial layer 30 and the polycrystalline GeSi layer 35. In order to define the base of the transistor, a second silicon nitride layer 42 and a silicon dioxide layer 44 are subsequently formed on the second polysilicon layer 40 followed by patterning them. So the patterned second silicon nitride layer 42 and the patterned silicon dioxide layer 44 are formed on the surface of the second polysilicon layer 40 in the first area 14a.

Then an implantation step is utilized to form the $P^+$ region, besides, an oxidation step is utilized to proceed with the wafer, so the portion of the second polysilicon layer 40 without coverage from the patterned second silicon nitride layer 42 are transformed to the third silicon dioxide layer 46 as shown in FIG. 1E. In addition, the $P^+$ region is driven deeper into the $n^-$ epitaxial layer 14. Subsequently, as shown in FIG. 1E, the patterned second silicon dioxide layer 44 is removed, and the patterned second silicon nitride layer 42 is exposed. Followed by etching the patterned second silicon nitride layer 42, a portion of the first silicon nitride layer 38 was covered by the remaining second polysilicon layer 40 and the remaining second polysilicon layer 40 are removed, as shown in FIG. 1F, and a portion of the GeSi epitaxial layer 30 is exposed.

Followed by subsequently forming a $n^+$ polysilicon layer 50 and a third silicon nitride layer 52 on the exposed portion of GeSi epitaxial layer 30, a photolithography step and an etching step are employed to define the $n^+$ polysilicon layer 50, the third silicon nitride layer 52, and the third silicon dioxide layer 46, thus forming the patterned $n^+$ polysilicon layer 50 and the patterned third silicon nitride layer 52 as shown in FIG. 1G. Besides, a portion of the third silicon dioxide layer 46 covered by the patterned n+ polysilicon layer 50 still remained after the foregoing etching step. The patterned n+ polysilicon layer 50 composed the emitter of the SiGe bipolar transistor.

Next, a photolithography step and an etching step are employed to etch a portion of the first silicon nitride layer 38, the polycrystalline GeSi layer 35 to the native oxide layer 22, a portion of the second silicon dioxide pattern 18b, and a portion of the first silicon dioxide pattern 18a are exposed as shown in FIG. 1H. The patterned silicon nitride layer 38 and the patterned polycrystalline GeSi layer 35 are electrically coupled to the base of the SiGe bipolar transistor. Besides, the n⁻ epitaxial layer 14 in the second area 14b is electrically coupled to the collector of the SiGe bipolar transistor.

According to the prior art, the n⁻ epitaxial layer 14 and the GeSi epitaxial layer 30 are not formed insitu, so the quality of the base of the SiGe bipolar transistor is easily out of control. In order to remove the native oxide layer resulted from the reason mentioned above, the operator is obliged to use HF to clean the wafer before forming the base of the SiGe bipolar transistor. In addition, the cleaning step can not thoroughly remove the native oxide layer before forming the GeSi epitaxial layer (base). So the prior art takes more time to preclean the wafer so as to remove the any impurity and native oxide at the surface and must carefully deposit the SiGe base layer in order to assure the good quality, especially that utilized in high frequency circuit.

SUMMARY OF THE INVENTION

A method for fabricating bipolar transistor frequently used in high frequency circuit is disclosed herein. The foregoing method employed to fabricate an epitaxial base bipolar transistor includes the following steps. According to one preferred embodiment of the present invention, the first step is to form a buried layer having a first conductivity in a substrate, and then the following step is to form a first oxide layer on the buried layer. Next, pattern the first oxide layer to expose a portion of the buried layer and use a first epitaxial process to selectively grow a epitaxial collector layer in the etched first oxide layer to cover the exposed portion of buried layer. Immediately use a second epitaxial process to subsequently grow a first epitaxial-base layer and a second epitaxial-base layer on the epitaxial collector layer and the etched portion of first oxide layer. The second epitaxial-base layer is formed on the first epitaxial-base layer, especially, the second epitaxial process and the first epitaxial process are performed insitu.

Subsequently, a TEOS layer is formed on the second epitaxial-base layer, and then patterned to expose a first portion of the second epitaxial-base layer. Next, form a poly emitter layer on the first portion of the second epitaxial-base layer and the TEOS layer. The next step is to pattern the poly emitter layer and the TEOS layer to expose a second portion of the second epitaxial-base layer. Then implant the second portion of the second epitaxial-base layer to form extrinsic base of the bipolar transistor in the second portion of the second epitaxial-base layer. Subsequently, pattern the second portion of the second epitaxial-base layer and the first epitaxial-base layer to expose a portion of the first oxide layer. The patterned second portion of the second epitaxial-base layer together with the etched first epitaxial-base layer make up the epitaxial base of the bipolar transistor, the patterned poly emitter layer composes the emitter of the bipolar transistor, and the epitaxial collector layer on the buried layer make the collector of the bipolar transistor.

The foregoing substrate is of the sheet resistance about 15–25 Ohms-cm. When the buried layer is formed using Sb as dopant source, the implanting energy is about 50 to 100 KeV, the concentration of the dopant is about $1E^{15}$ to $2E^{16}$. At this situation, the buried layer is disposed in 1150–1250° C. for about 60–120 minutes. When the buried layer is formed using As as dopant source, the implanting energy is about 50 to 100 KeV, the concentration of the dopant is about $1E^{15}$ to $2E^{16}$. At this situation, the buried layer is disposed in 1100–1200° C. for about 60–120 minutes. The foregoing buried layer is annealed to enlarge depth of the first doped region to a depth more than 1 micron. The first oxide layer and the epitaxial collector layer are of the thickness about 1000–5000 angstroms, wherein the epitaxial collector layer is formed containing boron of concentration about $1E^{15}$ to $5E^{17}$ cm⁻³. The first epitaxial-base layer mentioned above is made of epitaxial SiGe, wherein the Ge composition is about 0–30%, and boron is utilized as dopant, the concentration of boron is about $1E^{18}$ to $1E^{20}$ cm⁻³. The second epitaxial-base layer is about 200 angstroms in thickness, and the sheet resistance of the second epitaxial-base layer is about 0.5 Ohms-cm.

According to the other preferred embodiment of the present invention, the first step is to form a buried layer having a first conductivity in a substrate, and then the following step is to form a first oxide layer on the buried layer. Next, pattern the first oxide layer to expose a portion of the buried layer and use a first epitaxial process to selectively grow a epitaxial collector layer in the etched first oxide layer to cover the exposed portion of buried layer. Then use an insitu second epitaxial process to subsequently grow a first epitaxial-base layer, a second epitaxial-base layer, and a third epitaxial-base layer on the epitaxial collector layer and the etched portion of first oxide layer. The second epitaxial-base layer is formed on the first epitaxial-base layer, the third epitaxial-base layer is formed on the second epitaxial-base layer. Particularly the second epitaxial process and the first epitaxial process are performed insitu.

Then a TEOS layer is formed on the third epitaxial-base layer, a first silicon nitride layer is formed on the TEOS layer. Pattern the first silicon nitride layer, the TEOS layer, the third epitaxial-base layer, the second epitaxial-base layer, and the first epitaxial-base layer to expose a portion of the first oxide layer. Subsequently, etch a portion of the patterned first silicon nitride layer, the TEOS layer, the third epitaxial-base layer, and the second epitaxial-base layer to expose a portion of the first epitaxial-base layer. Then anneal the expose portion of the first epitaxial-base layer to form a sacrifical oxide layer on the exposed portion of the first epitaxial-base layer, and remove the sacrifical oxide layer to expose a portion of the first epitaxial-base layer. Next a pad oxide layer is formed on the exposed portion of the first epitaxial-base layer.

Subsequently, form a second silicon nitride layer on the etched first silicon nitride layer, on the surface of the pad oxide layer, on the side-wall of the patterned TEOS layer, the patterned third epitaxial-base layer, the patterned second epitaxial-base layer, and the patterned first epitaxial-base layer. Then form a first polysilicon layer on the topography of the second silicon nitride layer. Then etch the first polysilicon layer to form a polysilicon spacer on sidewall of a portion of the second silicon nitride layer underlying the pad oxide layer. Etching the second silicon nitride layer to expose the first silicon nitride layer and a portion of the pad oxide layer, and then etch the exposed portion of the pad oxide layer to expose a part of the exposed portion of the first epitaxial-base layer.

Next, form a second polysilicon layer on the first oxide layer, the first silicon nitride layer, the polysilicon spacer, and the part of the exposed portion of the first epitaxial-base layer. Then implant a plurality of charges into the second poly-silicon layer. Subsequently, pattern the second polysilicon layer to expose the exposed portion of the first oxide layer, and a portion of the patterned first silicon nitride layer. The patterned second polysilicon layer makes up the emitter of the bipolar transistor, the patterned first epitaxial-base layer composes the intrinsic base of the bipolar transistor. The patterned third epitaxial-base layer, and the patterned second epitaxial-base layer composes extrinsic base of the bipolar transistor, the intrinsic base and the extrinsic base composes the base of the bipolar transistor. The epitaxial collector layer on the buried layer makes up the collector of the bipolar transistor.

In the other preferred embodiment of the present invention, the foregoing substrate is of the sheet resistance about 15–25 Ohms-cm. When the buried layer is formed using Sb as dopant source, the implanting energy is about 50 to 100 Kev, the concentration of the dopant is about $1E^{15}$–$2E^{16}$ cm$^2$. At this situation, the buried layer is disposed in 1150–1250° C. for about 60–120 minutes. When the buried layer is formed using As as dopant source, the implanting energy is about 50 to 100 Kev, the concentration of the dopant is about $1E^{15}$ to $2E^{16}$ cm$^{2-}$. At this situation, the buried layer is disposed in 1100–1200° C. for about 60–120 minutes. The foregoing buried layer is annealed to enlarge depth of the first doped region to a depth more than 1 micron. The first oxide layer and the epitaxial collector layer are of the thickness about 1000–5000 angstroms, wherein the epitaxial collector layer is formed containing boron of concentration about $1E^{15}$ to $5E^{17}$ cm$^{-2}$. The first epitaxial-base layer mentioned above is made of epitaxial SiGe, wherein the Ge composition is about 0–30%, and boron is utilized as dopant, the concentration of boron is about $1E^{18}$ to $1E^{20}$ cm$^{-3}$. The second epitaxial-base layer is made of P-type Si, the concentration of the dopant in the P-type Si is about $5E^{20}$cm$^{-3}$. The third epitaxial-base layer is made of undoped Si about 100 angstroms in thickness. A time mode etching process is utilized to etch a portion of the patterned first silicon nitride layer, the TEOS layer, the third epitaxial-base layer, and the second epitaxial-base layer.

BRIEF DESCRIPTION OF THE DRAWINGS

The above features of the present invention will be more clearly understood from consideration of the following descriptions in connection with accompanying drawings in which.

DESCRIPTION OF THE PREFERRED EMBODIMENT

In fabricating the epitaxial-base bipolar transistor according to the prior art, two separate epitaxial processes are employed in fabricating the bipolar transistor. One epitaxial process is used to form the collector, and the other epitaxial process is utilized to form the base of the bipolar transistor. However, the two epitaxial processes are separately performed, so the quality of the base of the fabricated bipolar transistor is not good. Particularly, the quality of the base of the bipolar transistor is very important to the characteristic of the transistor especially when utilized in high frequency circuit. So the present invention is designed to improve the quality of the base of the bipolar transistor.

In addition, the present invention improves the characteristic of the bipolar transistor such that it has higher three-decibel-frequency (three dB frequency) and higher maximum frequency than that of the prior art due to the better quality of the base of the fabricated bipolar transistor in the present invention. So the present invention can fabricate the bipolar transistor having good quality, especially for the transistor utilized in high frequency circuit.

Figure 1A:
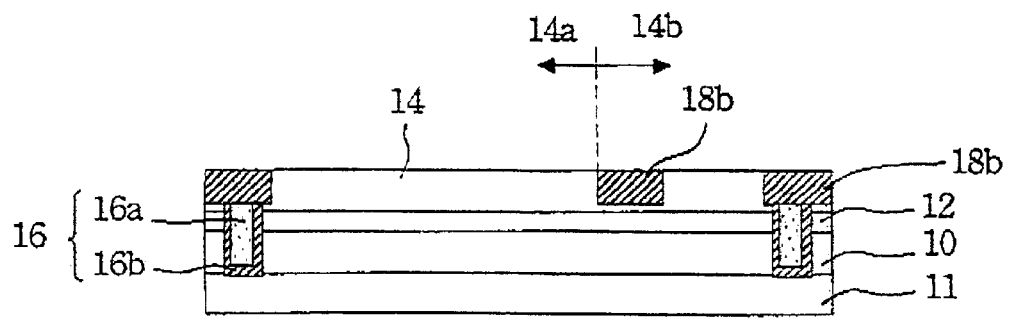
FIGS. 1A to 1H illustrate the processes utilized to fabricate the SiGe bipolar transistor having two layer of epitaxial layer according to the prior art.
Figure 1B:
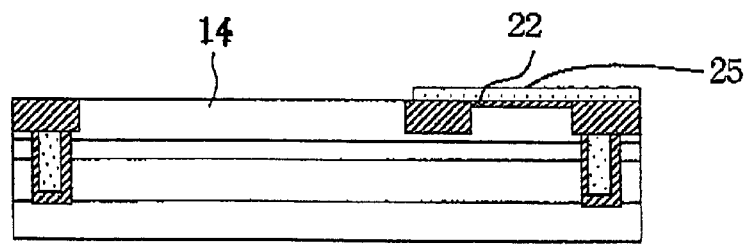
Figure 1C:
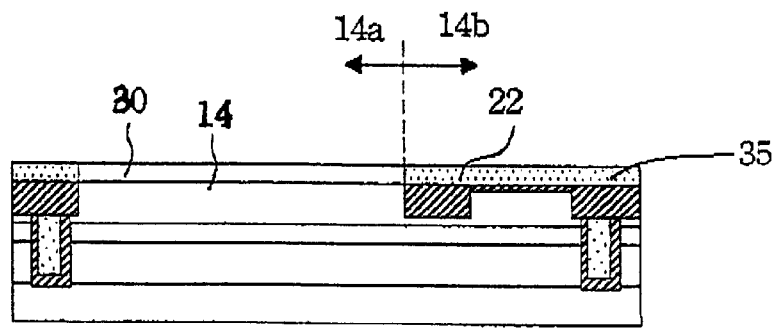
Figure 1D:
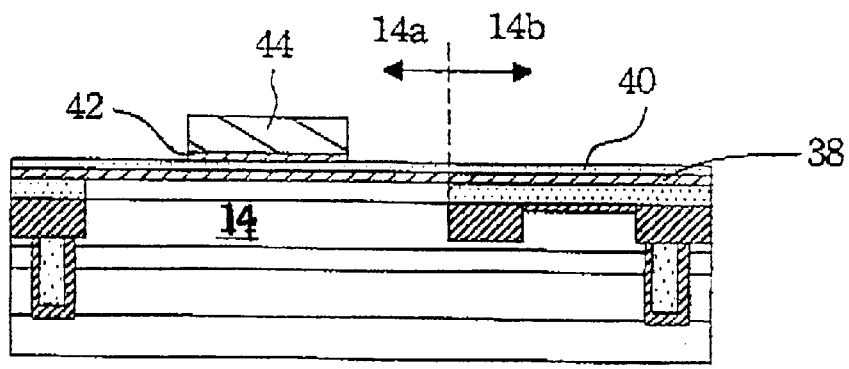
Figure 1E:
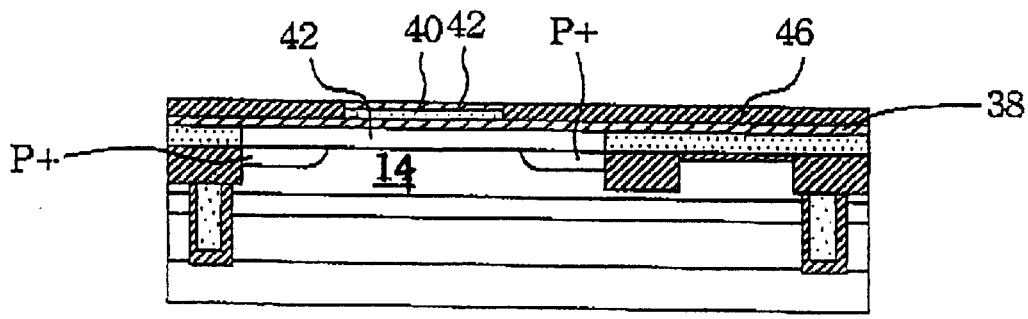
Figure 1F:
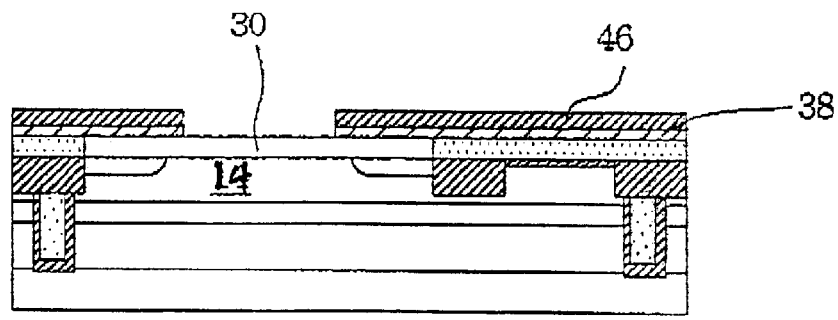
Figure 1G:
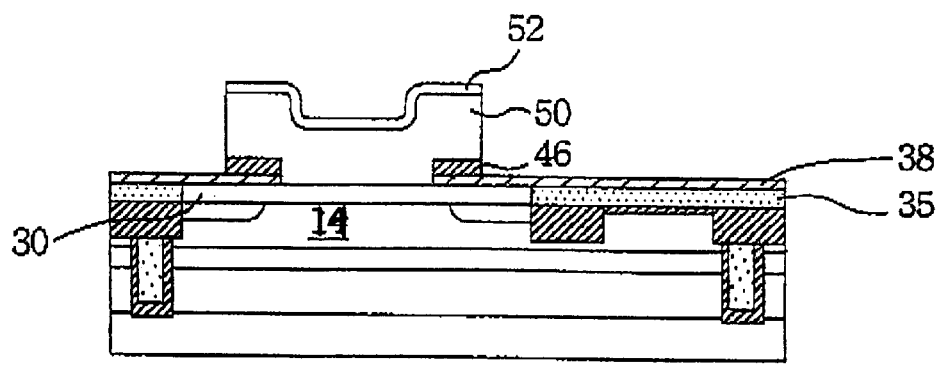
Figure 1H:
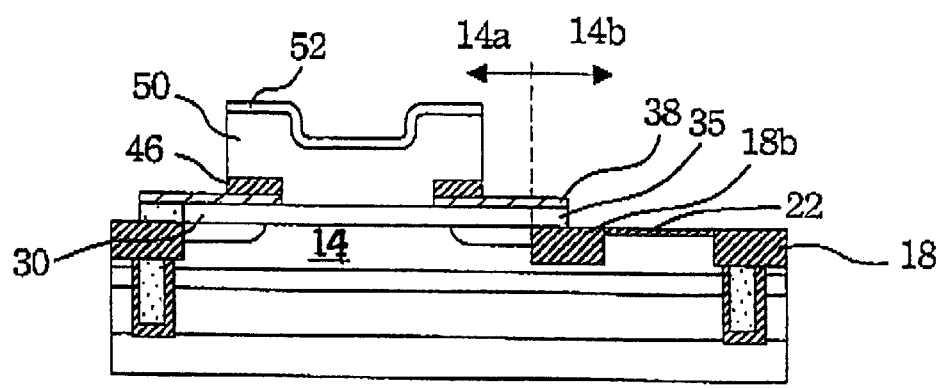
Figure 2:
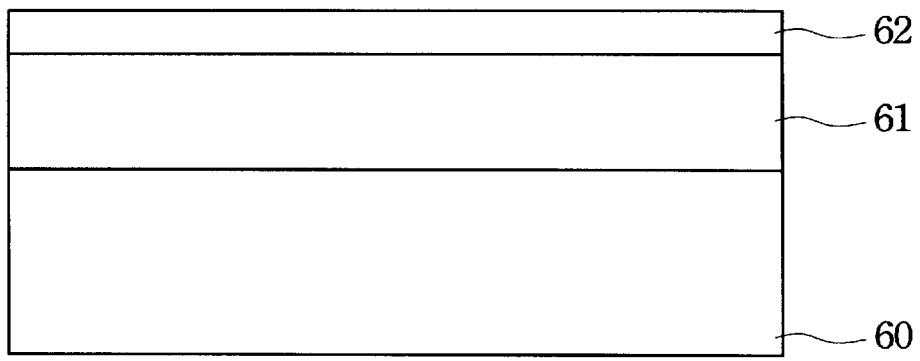
FIGS. 2A to 2J illustrate the processes utilized to fabricate the epitaxy base bipolar transistor according to one preferred embodiment of the present invention.
Figure 2:
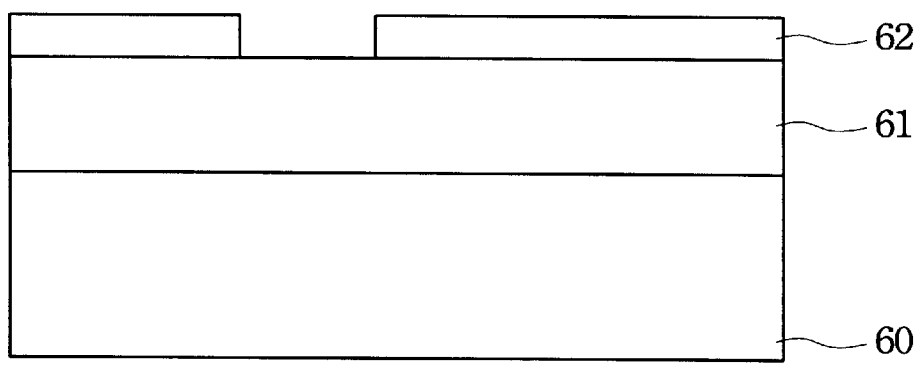
Figure 2:
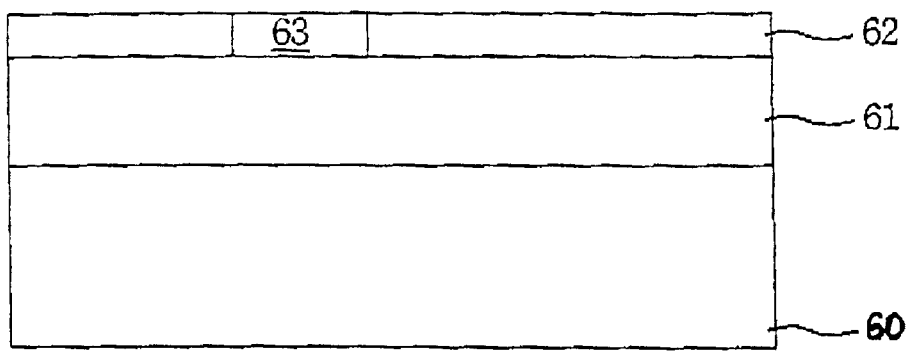
Figure 2:
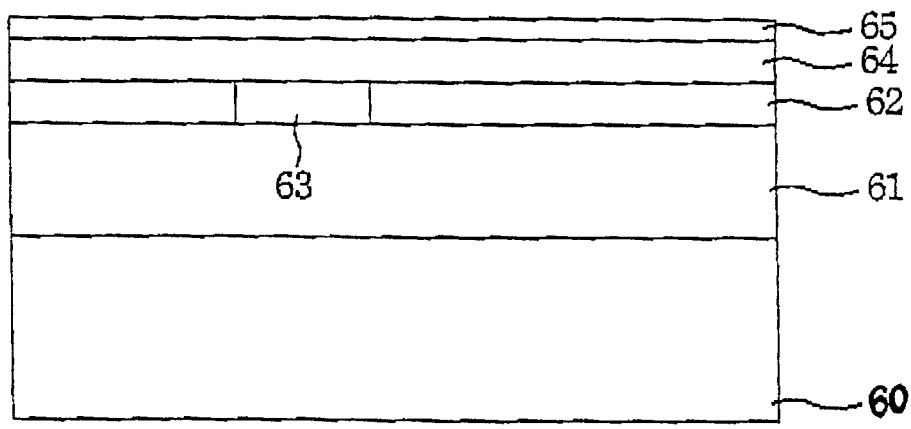
Figure 2:
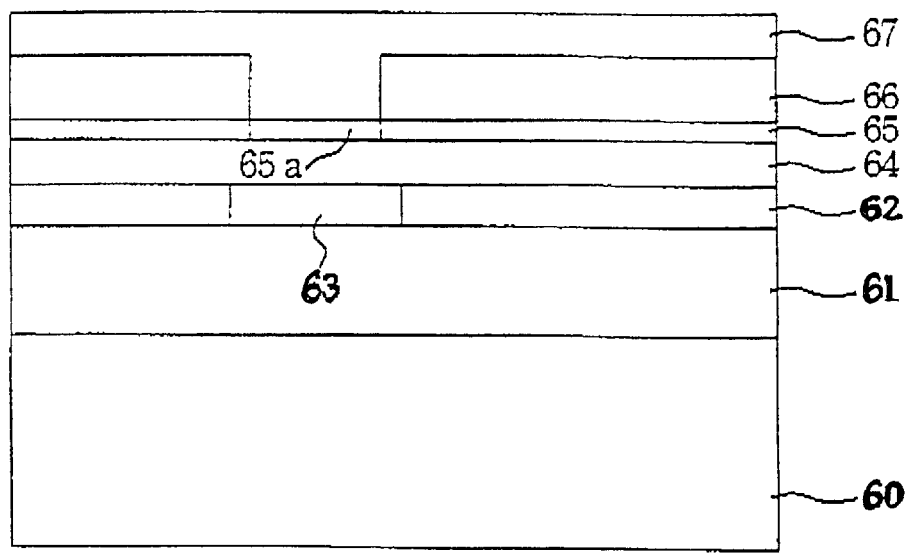
Figure 2:
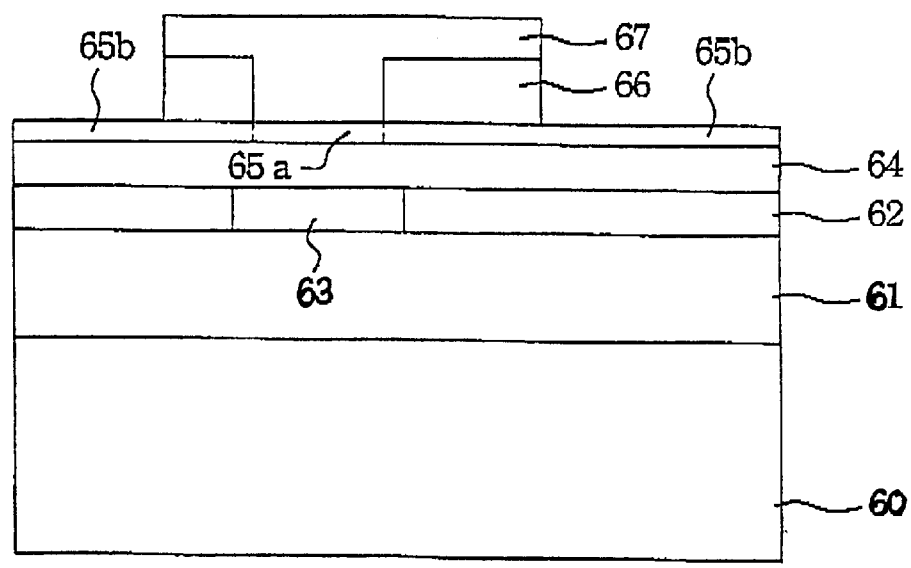
Figure 2:
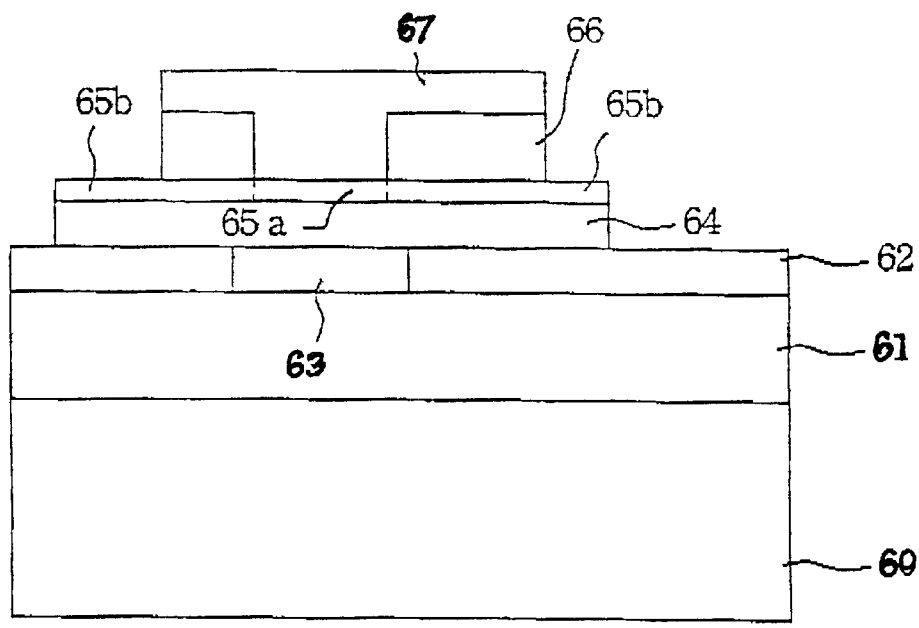
Figure 2:
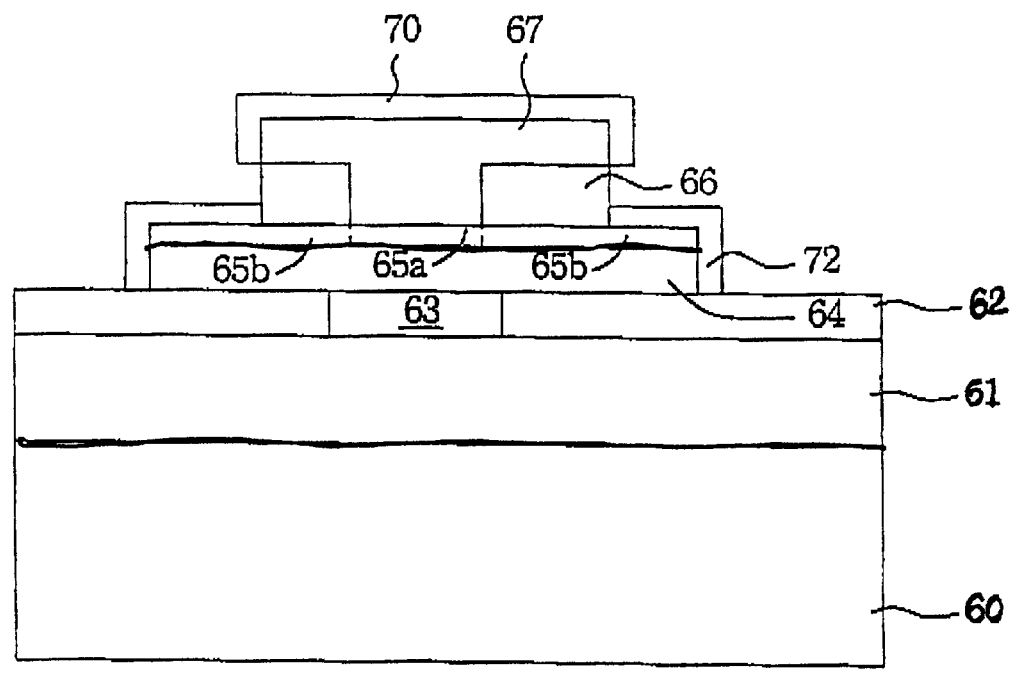

The process sequence employed to manufacture the bipolar transistor is described to illustrate how a SiGe bipolar transistor is fabricated by the method according to one preferred embodiment of the present invention. As shown in FIG. 2A, a buried layer photomask (not shown) is utilized in a photolithography step preformed to a silicon substrate 60, and then a first implantation step is used to implant the dopants having a first conductivity into the substrate to form a buried layer 61. The substrate 60 mentioned above is of the sheet resistance about 15–25 Ohms-cm. According to one preferred embodiment of the present invention, the buried layer 61 is fabricated by using Sb as source of dopant, in addition, the implanting energy is about 50 to 100 KeV. The concentration of the dopant is about $1E^{15}$ to $2E^{16}$ cm$^{-2}$, besides the buried layer 61 is disposed in 1150–1250° C. for about 60–120 minutes. However, when the buried layer is formed by using As as source of dopant, the implanting energy is about 50 to 100 KeV, and the concentration of the dopant is about $1E^{15}$ to $2E^{16}$ cm$^{-2}$. Also, in this situation, the buried layer 61 is disposed in 1100° C. to 1200 °C. for about 60–120 minutes. Further, the buried layer 61 is annealed to enlarge depth of the doped region to a depth more than 1 micron. The thickness of the first oxide layer 62 and the epitaxial collector layer 63 are of the thickness more than about 1000 to 5000 angstroms.

Followed by removing the buried layer mask, a first oxidation step is used to grow a first oxide layer 62 having thickness about 1000 to 5000 angstroms on the buried layer 61. Then referring to FIG. 2B, a first photolithography and etching step is used to etch a portion of the first oxide layer 62, thus a portion of the buried layer 61 is exposed. Turning to FIG. 2C, a first epitaxial process is employed to grow an epitaxial silicon layer 63 on the exposed portion of the buried layer 61. Followed by the selective epitaxial collector growth process forming the epitaxial silicon layer 63, referring to FIG. 2D, a second epitaxial process is used to form a SiGe layer 64 on the etched first oxide layer 62 and the epitaxial silicon layer 63, and then a undoped Si layer 65 is formed on the SiGe layer 64.

The epitaxial silicon layer 63 formed by the selective epitaxial collector growth process contains the dopant concentration about $1E^{15}$ to $5E^{17}$ cm$^{-3}$, and $1E^{16}$ cm$^{-3}$ is preferred. The dopant in the SiGe layer 64 contains Ge about 0 to 30%, and the concentration of Boron is about $1E^{18}$ to $1E^{20}$ cm$^{-3}$. Besides, the first epitaxial process and the second epitaxial process is performed in the same tube, in other words, the epitaxial silicon layer 63, the SiGe layer 64, and the undoped Si layer 65 are formed insitu. After the SiGe layer 64 had been formed on the epitaxial silicon layer 63 and the etched first oxide layer 62, the dopant source is tuned to zero when forming the undoped Si layer 65.

Refer to FIG. 2E, a TEOS layer 66 is formed on the undoped Si layer 65, then a second photolithography step using an emitter window photomask and a second etching process are utilized to etch the TEOS layer 66, thus an emitter window is etched in the TEOS layer 66, and a first portion of the undoped Si layer 65a is exposed. Subsequently, a poly emitter deposition process is used to deposit the poly-silicon emitter layer 67 on the etched TEOS layer 66 and on the exposed first portion of the undoped Si layer 65a. Subsequently, a third photolithography step using a poly-emitter photomask and a third etching process are utilized to etch a portion of the poly-silicon emitter layer 67 and TEOS layer 66. Referring to FIG. 2F, a second portion of the undoped Si layer 65b without shield from the etched TEOS layer 66 is exposed, and a second implantation step is employed to form the extrinsic base in the second portion of the undoped Si layer 65b.

In the following process, referring to FIG. 2G, a fourth photolithography step using the epitaxial base photomask (not shown) and the fourth etching step to etching a part of the second portion of the undoped Si layer 65b and its underlying SiGe layer 64, thus exposing a portion of the underlying first oxide layer 62. Referring to FIG. 2H, a metal oxide layer is formed on the surface of the wafer, followed by an annealing step, a portion of the metal layer on the oxide layer is then removed, and an emitter silicide layer 70 and the collector silicide layer 72 are formed on the surface of the poly-silicon emitter layer 67 and the etched second portion of the undoped Si layer 65b as well as its underlying SiGe layer 64 respectively. The thickness of the emitter silicide layer 70 and the collector silicide layer 72 is about 500–1000 angstroms. Besides, the poly-silicon emitter layer 67, the etched second portion of the undoped Si layer 65b together with its underlying SiGe layer 64, and the epitaxial silicon layer 63 acts as the emitter, base, and collector of the bipolar transistor respectively.

Figure 2I:
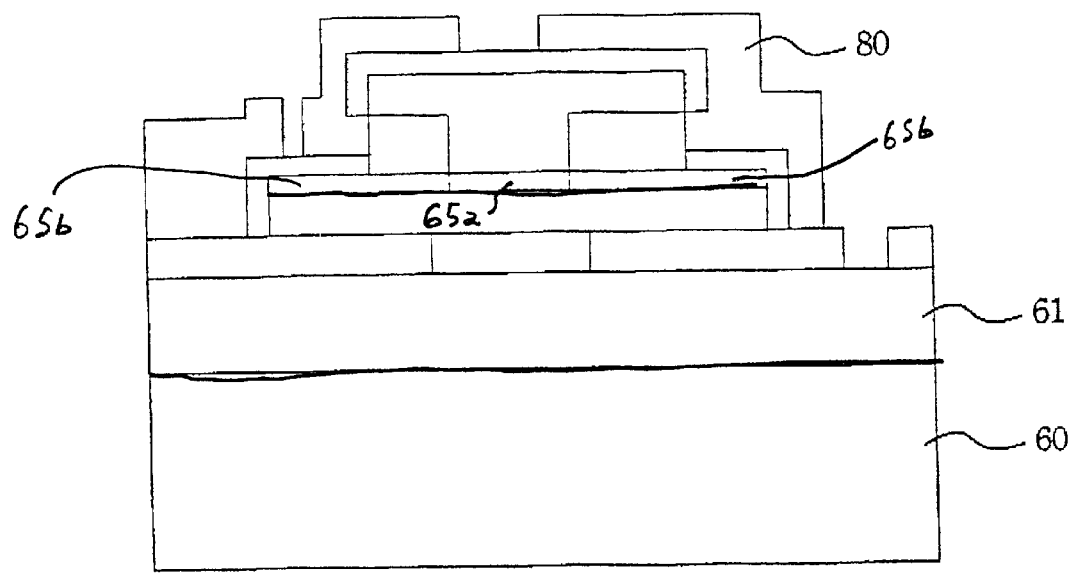
Figure 2J:
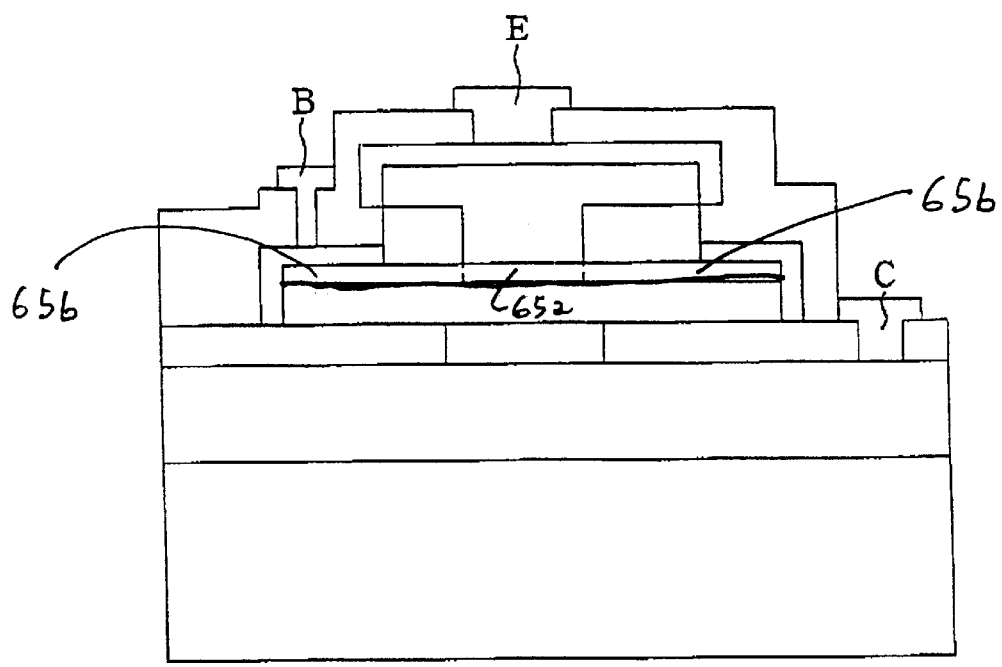

Referring to FIG. 2I, a BPSG (borophosphosilicate glass)/TEOS layer 80 is formed on the wafer, then a rapid thermal process is performed, and a fifth photolithography step and an etching step are used to etch the BPSG/TEOS layer 80. Thus a plurality of contact holes is formed in the BPSG/TEOS layer 80. Subsequently, a metal layer is formed on the topography of the wafer, then a sixth photolithography step using a metal photomask and a etching step is used to pattern the metal layer to form the emitter electrode E, the base electrode B, and the collector electrode C. Next, the traditional processes can be used to fabricate the other elements of the bipolar transistor.

Figure 3:
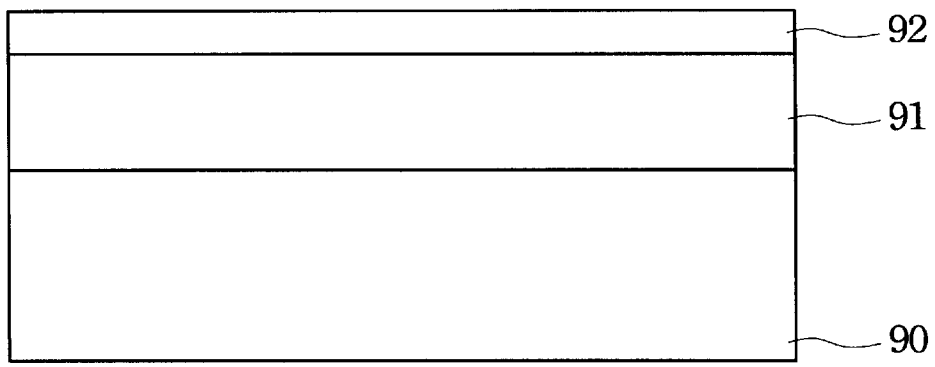
FIGS. 3A to 3J illustrate the processes utilized to fabricate the epitaxy base bipolar transistor according to the other preferred embodiment of the present invention.
Figure 3:
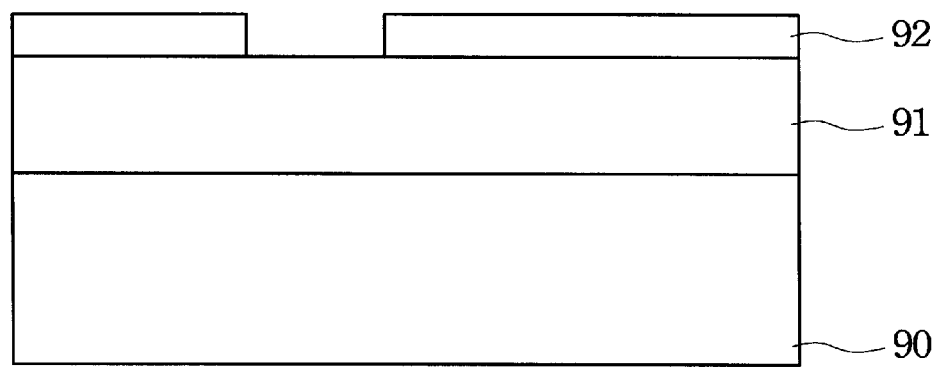
Figure 3:
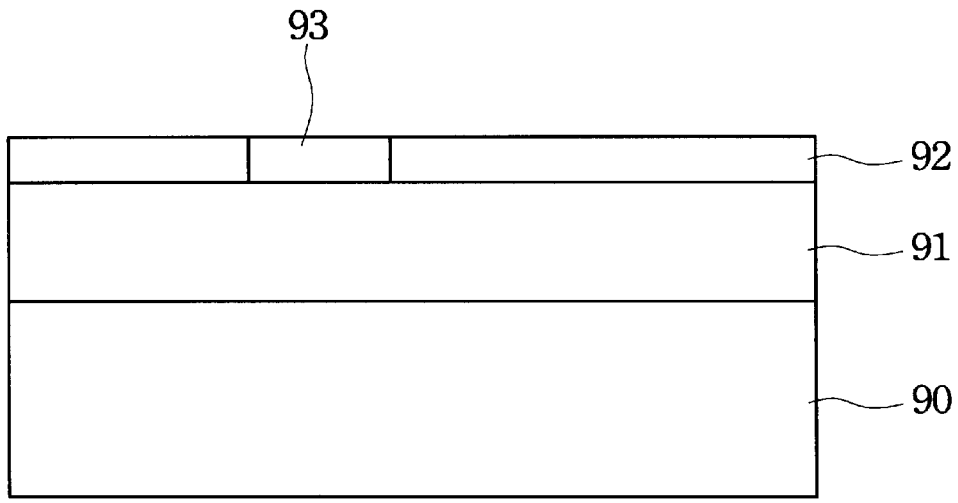
Figure 3:
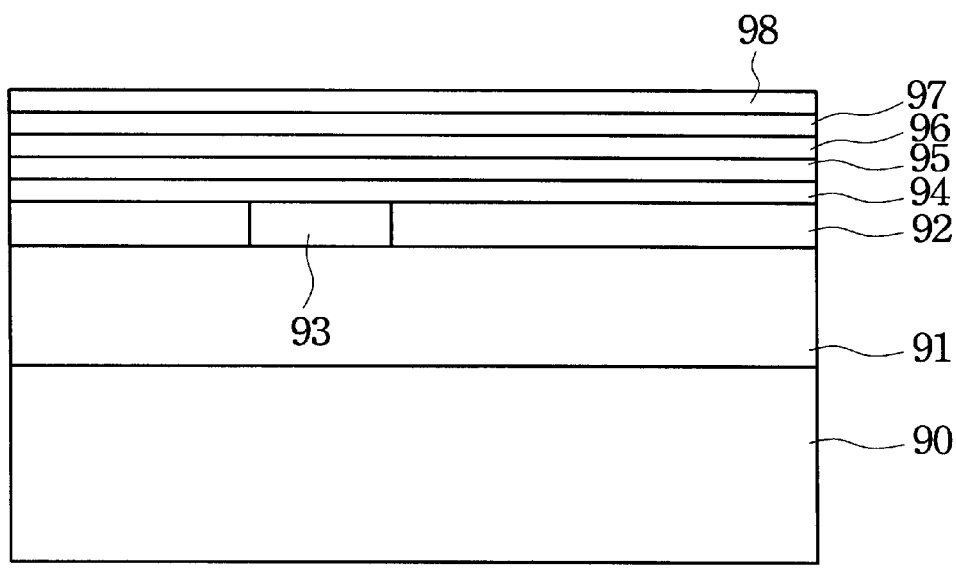
Figure 3:
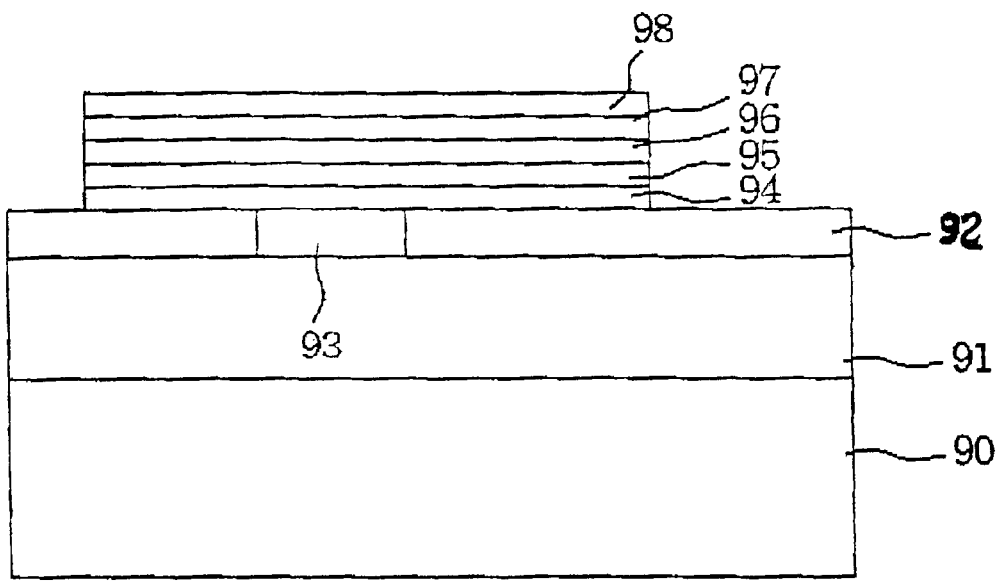
Figure 3:
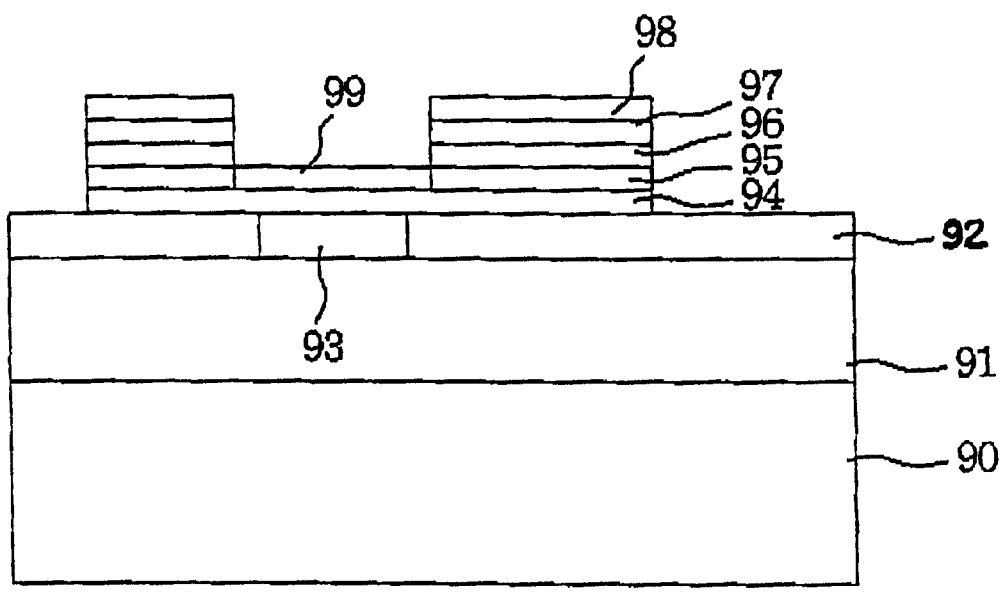
Figure 3:
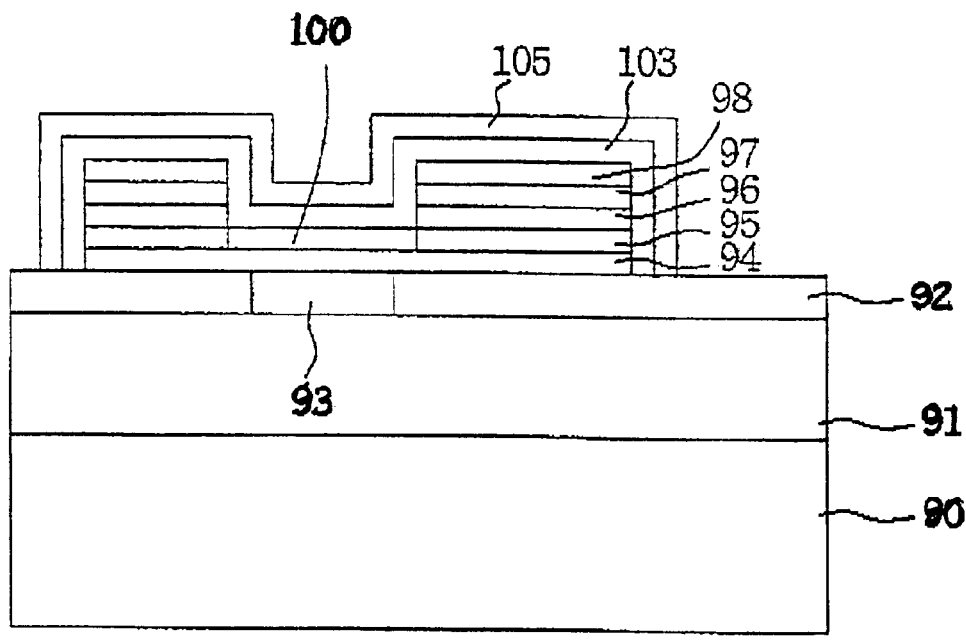
Figure 3:
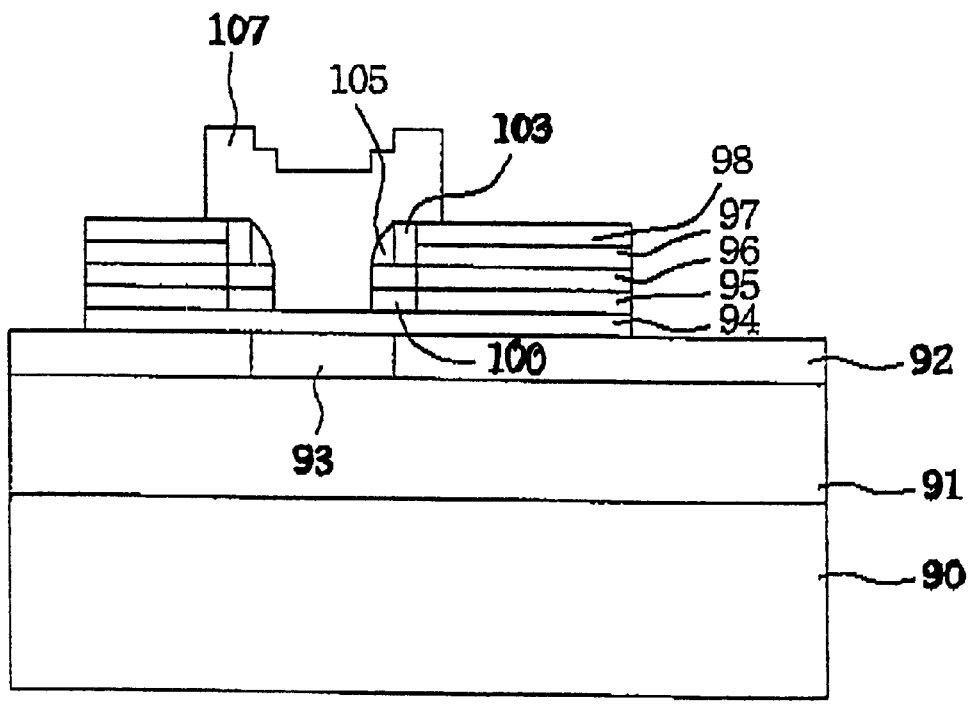
Figure 3:
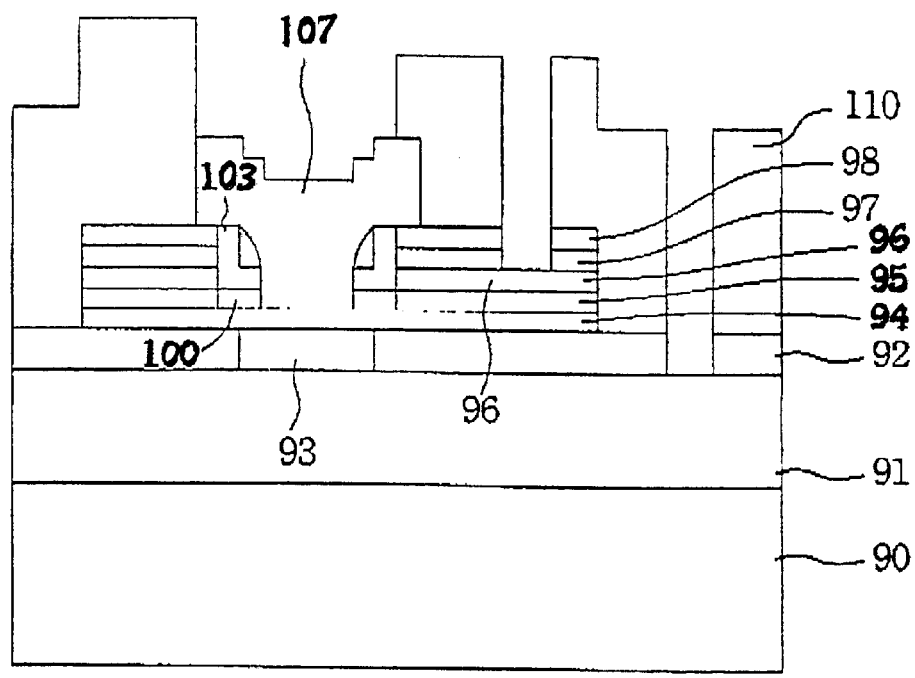
Figure 3:
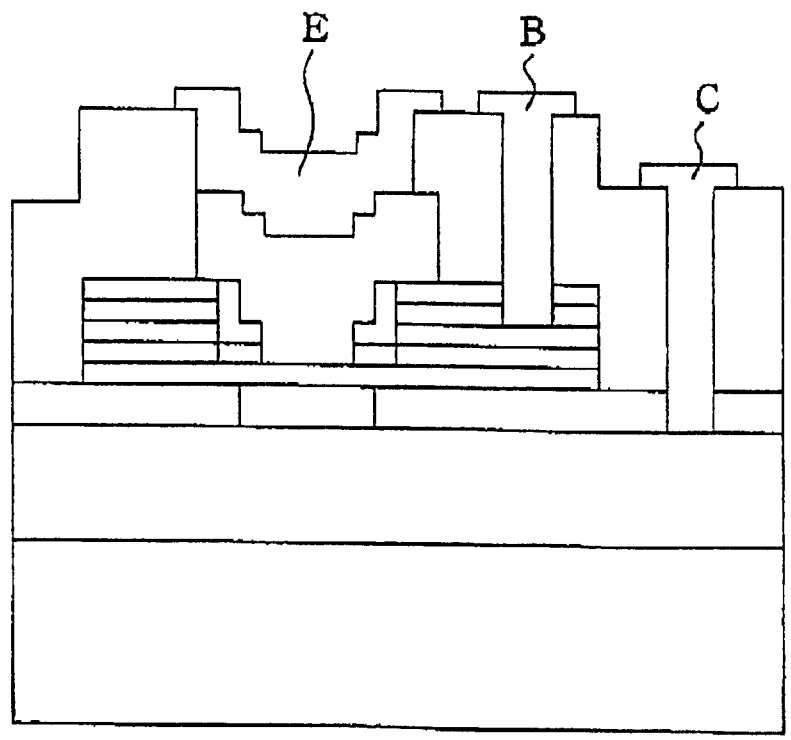

The process sequence employed to manufacture the bipolar transistor according to the other preferred embodiment of the present invention is described to illustrate how a SiGe bipolar transistor is fabricated. As shown in FIG. 3A, a buried layer photomask (not shown) is utilized to perform to a silicon substrate 90, and then a first implantation step is used to implant the dopants having a first conductivity into the substrate to form a buried layer 91. Followed by removing the buried layer mask, a first oxidation step is used to grow a first oxide layer 92 having thickness about 1000–5000 angstroms on the buried layer 91. Then referring to FIG. 3B, a first photolithography and etching step is used to etch a portion of the first oxide layer 92, thus a portion of the buried layer 91 is exposed. Turning to FIG. 3C, a first epitaxial process is employed to grow an epitaxial silicon layer 93 on the exposed portion of the buried layer 91. Followed by the selective epitaxial collector growth process forming the epitaxial silicon layer 93, referring to FIG. 3D, a second epitaxial process is used to form a SiGe layer 94 on the etched first oxide layer 92 and the epitaxial silicon layer 93, then a doped Si layer 95 is formed on the SiGe layer 94, and an undoped Si layer 96 is formed on the doped Si layer 95.

The epitaxial silicon layer 93 formed by the selective epitaxial collector growth process contains the dopant concentration about $1E^{15}$ to $5E^{17}$ cm$^{-3}$, and $1E^{16}$ cm$^{-3}$ is preferred. The dopant in the SiGe layer 94 contains Ge about 0 to 30%, and the concentration of Boron is about $1E^{18}$ to $1E^{20}$ cm$^{-3}$. The doped Si layer 95 formed on the SiGe layer 94 contains dopant of concentration about $5E^{20}$ cm$^{-3}$. The thickness of the undoped Si layer 96 is about 100 angstroms. Particularly, the first epitaxial process and the second epitaxial process is performed in the same tube, in other words, the epitaxial silicon layer 93, the SiGe layer 94, the doped Si layer 95, and the undoped Si layer 96 are formed insitu. The doped Si layer 95 in this preferred embodiment of the present invention acts as the extrinsic base of the transistor. After the SiGe layer 94 had been formed on the epitaxial silicon layer 93 and the etched first oxide layer 92, the charge having a second conductivity (such as boron) is used as the dopant source when fabricating the doped Si layer. And then the dopant source is tuned to zero when forming the undoped Si layer 96.

Turning to FIG. 3D, a TEOS layer 97 is formed on the undoped Si layer 96, and a silicon nitride layer 98 is formed on the TEOS layer 97. The thickness of the TEOS layer 97 is about 500 angstroms, and the thickness of the silicon nitride layer 98 is about 800 angstroms. Referring to FIG. 3E, a second photolithography step and an etching step are used to pattern the SiGe layer 94, the doped Si layer 95, the undoped Si layer 96, the TEOS layer 97, and the first silicon nitride layer 98, thus a portion of the etched first oxide layer 92 is exposed.

Followed by a third photolithography step using an emitter window photomask and a time mode etching step, a portion of the patterned doped Si layer 95, the undoped Si layer 96, the TEOS layer 97, and the first silicon nitride layer 98 are etched to expose the patterned SiGe layer 94. Refer to FIG. 3F, then an annealing step is performed and a sacrifical oxide layer 99 is formed on the patterned SiGe layer 94. Turning to FIG. 3G, followed by removing the sacrifical oxide layer 99, a pad oxide layer 100 is formed on the patterned SiGe layer 94. In addition, a second silicon nitride layer 103 is formed on the surface of the pad oxide layer 100, the patterned first silicon nitride layer 98, the TEOS layer 97, the undoped Si layer 96, the doped Si layer 95, and the patterned SiGe layer 94. Then a first poly-silicon layer 105 is formed on the surface of the second silicon nitride layer 103.

The first poly-silicon layer 105 is etched, and the residual first poly-silicon layer 105 forms the spacer. Using the residual first poly-silicon layer 105 as mask, the second silicon nitride layer 103 is subsequently etched to expose a portion of the pad oxide layer 100. Subsequently, the exposed portion of the pad oxide layer 100 is wet etched to expose a portion of the underlying patterned SiGe layer 94. Referring to FIG. 3H, a second poly-silicon layer 107 is formed on the surface of the wafer, and a fourth photolithography step using a poly emitter photomask and an etching step are employed to etch the second poly-silicon layer 107. The etched second poly-silicon layer 107 is thus formed on the second silicon nitride layer 103 and the exposed portion of the patterned SiGe layer 94.

Then perform a LTO (Low Temperature Oxidation) process and a BPSG deposition to form a BPSG layer 110 on the wafer, and then a flow process is performed to planarize the surface of the BPSG layer 110 as shown in FIG. 3I. Then a fifth photolithography step using a contact photomask and an etching step are used to etch a portion of the the BPSG layer 110, the underlying patterned first silicon nitride layer 98, the TEOS layer 97, and the first oxide layer 92. Thus a plurality of contact holes are formed in the BPSG layer 110, and a portion of the undoped Si layer 96, the second poly-silicon layer 107, and the buried layer 91 are exposed.

Then use the traditional process to fabricate the other elements of the bipolar transistor. For example, referring to FIG. 3J, a contact implant step is performed, and a TEOS deposition process is also performed followed by a rapid thermal processing remained at temperature about 800–1000° C. for about 10–20 seconds. In the preferred embodiment of the present invention, 900–950° C. and 10 seconds are preferred. Subsequently, a metal layer is formed on the topography of the wafer, then a sixth photolithography step using a metal photomask and a etching step is used to pattern the metal layer to form the emitter electrode E, the base electrode B, and the collector electrode C. Subsequently, the traditional processes can be used to fabricate the other elements of the bipolar transistor.

Although specific embodiments have been illustrated and described it will be obvious to those skilled in the art that various modification may be made without departing from the spirit, which intended to be limited solely by the appended claims. For example, the recipe utilized by the foregoing photolithography steps and etching step, in addition, the method utilized by the foregoing implantation steps can be varied without departing from the present invention.

What is claimed is:

1. A method for fabricating bipolar transistor having insitu-formed epitaxial layers in base, said method comprising the steps of:
   forming a buried layer having a first conductivity in a substrate;
   forming a first oxide layer on said buried layer;
   patterning said first oxide layer to form a first opening exposing a portion of said buried layer;
   using a first epitaxial process to selectively grow a epitaxial collector layer in said first opening, wherein said epitaxial collector layer serves as a collector of said bipolar transistor;
   using a second epitaxial process to sequentially grow a first epitaxial-base layer, a second epitaxial-base layer, and a third epitaxial-base layer on said epitaxial collector layer, said second epitaxial process and said first epitaxial process being performed in situ;
   forming a TEOS layer on said third epitaxial-base layer;
   forming a first silicon nitride layer on said TEOS layer;
   patterning said first silicon nitride layer, said TEOS layer, said third epitaxial-base layer, said second epitaxial-base layer, and said first epitaxial-base layer to expose an outer portion of said first oxide layer;
   etching a portion of said patterned first silicon nitride layer, said TEOS layer, said third epitaxial-base layer, and said second epitaxial-base layer to form a second opening exposing a central portion of said first epitaxial-base layer being on said epitaxial collector layer, wherein said patterned first epitaxial-base layer serves as an intrinsic base, said patterned second epitaxial-base layer and said patterned third epitaxial-base layer serve as an extrinsic base, and a base of said bipolar transistor is composed of said intrinsic base and said extrinsic base;
   annealing said first epitaxial-base layer to form a sacrificial oxide layer on said central portion of said first epitaxial-base layer;
   removing said sacrificial oxide layer to expose said central portion of said first epitaxial-base layer;
   forming a pad oxide layer on said central portion of said first epitaxial-base layer;
   forming a second silicon nitride layer to conformably cover said substrate;
   forming a first poly-silicon layer conformably on said second silicon nitride layer;
   anisotropically etching said first poly-silicon layer to form a poly-silicon spacer on side-wall of said second silicon nitride layer covering said second opening;
   etching exposed portions of said second silicon nitride layer to expose said first silicon nitride layer and a portion of said pad oxide layer;
   etching said exposed portion of said pad oxide layer to expose a portion of said central portion of said first epitaxial-base layer;
   forming a second poly-silicon layer to cover said substrate;
   implanting dopants having a first conductivity into said second poly-silicon layer; and
   patterning said second poly-silicon layer to cover said second opening, wherein said patterned second poly-silicon layer serves as an emitter of said bipolar transistor.

2. The method as claim 1 further comprising the steps of:
   forming a BPSG layer on said substrate;
   patterning said BPSG layer, said first silicon nitride layer, said TEOS layer, and said first oxide layer to form a plurality of contact holes exposing a portion of said patterned second poly-silicon layer, said third epitaxial-base layer, and said buried layer;
   implanting dopants to bottom of said plurality of contact holes;
   forming a passivation TEOS layer on said patterned BPSG layer and in said plurality of contact holes;
   patterning said passivation TEOS layer to expose said portion of said patterned second poly-silicon layer, said third epitaxial-base layer, and said buried layer;
   performing a rapid thermal process;
   forming a metal layer on said passivation TEOS layer, said portion of said patterned second poly-silicon layer, said third epitaxial-base layer, and said buried layer; and
   patterning said metal layer to form an emitter electrode connecting to said patterned second poly-silicon layer, a base electrode connecting to said third epitaxial-base layer, and a collector electrode connecting to said exposed portion of said burrier layer.

3. The method as claim 1, wherein said substrate has sheet resistance about 15–25 Ohms-cm.

4. The method as claim 1, wherein said buried layer is formed by using Sb as source of dopant, implanting energy is about 50 to 100 KeV, concentration of dopant is about $1E^{15}$ to $2E^{16}$ cm$^{-2}$.

5. The method as claim 4, wherein said buried layer is disposed in 1150–1250° C. for about 60–120 minutes.

6. The method as claim 1, wherein said buried layer is formed by using As as source of dopant, implanting energy is about 50 to 100 Kev, concentration of dopant is about $1E^{15}$ to $2E^{16}$ cm$^{-2}$.

7. The method as claim 6, wherein said buried layer is disposed in 1100° C. to 1200° C. for about 60–120 minutes.

8. The method as claim 1, wherein said buried layer is annealed to enlarge depth of said buried layer to a depth more than 1 micron.

9. The method as claim 1, wherein said first oxide layer and said epitaxial collector layer are of the thickness about 1000–5000 angstroms.

10. The method as claim 1, wherein said epitaxial collector layer is formed containing dopant having concentration about $1E^{15}$ to $5E^{17}$ cm$^{-3}$.

11. The method as claim 1, wherein said first epitaxial-base layer is made of epitaxial SiGe, Ge composition is about 0–30%, boron is utilized as dopant, concentration of boron is about $1E^{18}$ to $1E^{20}$ cm$^{-3}$.

12. The method as claim 1, wherein said second epitaxial-base layer is made of doped Si having conductivity other than said first conductivity, concentration of dopant in said doped Si is about $5E^{20}$ cm$^{-3}$.

13. The method as claim 1, wherein said third epitaxial-base layer is made of undoped Si about 100 angstroms in thickness.

14. The method as claim 1, wherein said portion of said patterned first silicon nitride layer, said TEOS layer, said third epitaxial-base layer, and said second epitaxial-base layer are etched by time mode etching process.

* * * * *

UNITED STATES PATENT AND TRADEMARK OFFICE
CERTIFICATE OF CORRECTION

PATENT NO. : 6,589,849 B1
DATED : July 8, 2003
INVENTOR(S) : Chwan-Ying Lee

It is certified that error appears in the above-identified patent and that said Letters Patent is hereby corrected as shown below:

Title page,
Insert Item -- [73] Assignee: Industrial Technology Research Institute, Taiwan, R.O.C. --

Signed and Sealed this

Ninth Day of August, 2005

JON W. DUDAS
*Director of the United States Patent and Trademark Office*